(12) United States Patent
Csaba et al.

(10) Patent No.: US 10,613,129 B2
(45) Date of Patent: Apr. 7, 2020

(54) METHODS AND APPARATUS FOR SPIN WAVE-BASED SPECTRUM ANALYZERS

(71) Applicant: University of Notre Dame du Lac, South Bend, IN (US)

(72) Inventors: Gyorgy Csaba, South Bend, IN (US); Adam Papp, South Bend, IN (US); Jonathan Chisum, South Bend, IN (US); Wolfgang Porod, South Bend, IN (US); Gary Bernstein, South Bend, IN (US)

(73) Assignee: University of Notre Dame du Lac, South Bend, IN (US)

( * ) Notice: Subject to any disclaimer, the term of this patent is extended or adjusted under 35 U.S.C. 154(b) by 339 days.

(21) Appl. No.: 15/439,639

(22) Filed: Feb. 22, 2017

(65) Prior Publication Data

US 2017/0248640 A1 Aug. 31, 2017

Related U.S. Application Data

(60) Provisional application No. 62/298,422, filed on Feb. 22, 2016.

(51) Int. Cl.
*G01R 33/12* (2006.01)
*G01R 23/16* (2006.01)

(52) U.S. Cl.
CPC ........ *G01R 23/16* (2013.01); *G01R 33/1284* (2013.01)

(58) Field of Classification Search
CPC ..... G01R 23/00; G01R 23/16; G01R 33/1284
See application file for complete search history.

(56) References Cited

U.S. PATENT DOCUMENTS

| 3,631,442 | A | * | 12/1971 | Fearon | G01S 13/753 340/572.2 |
| 4,716,390 | A | * | 12/1987 | Elliott | H03H 2/001 333/132 |
| 5,057,800 | A | | 10/1991 | Hanna | |
| 5,465,417 | A | * | 11/1995 | Tanbakuchi | H03D 7/1408 333/235 |
| 10,381,035 | B2 | * | 8/2019 | Crawford | H01F 1/11 |
| 2002/0196658 | A1 | * | 12/2002 | Mukasa | G11C 11/15 365/173 |

OTHER PUBLICATIONS

Adam, J.D., "Analog Signal Processing with Microwave Magnetics," Proc. IEEE, vol. 76, No. 2, pp. 159-170, Feb. 1988.

(Continued)

*Primary Examiner* — Alesa Allgood
(74) *Attorney, Agent, or Firm* — Greenberg Traurig, LLP

(57) ABSTRACT

An example device includes a magnetic film, two or more spin wave generators, and one or more detectors. The magnetic film is capable of supporting spin waves. The two or more spin wave generators are operable to create a diffraction pattern of the spin waves in the magnetic film. The two or more spin wave generators generate the spin waves based on a source signal. The one or more detectors are operable to measure an amplitude of the spin waves in the diffraction pattern. The amplitude measured by a particular detector is indicative of a property of the source signal.

14 Claims, 10 Drawing Sheets

(56) References Cited

OTHER PUBLICATIONS

Allivy Kelly et al., "Inverse spin Hall effect in nanometer-thick yttrium iron garnet/Pt system," Appl. Phys. Lett., vol. 103, No. 8, p. 082408, 2013.

Csaba et al., "Spin-wave based realization of optical computing primitives," J. Appl. Phys., vol. 115, No. 17, p. 17C741, May 2014.

Cherepov et al., "Electric-field-induced spin wave generation using multiferroic magnetoelectric cells, "Appl. Phys. Lett., vol. 104, No. 8, p. 082403, Feb. 2014.

Foster et al., "Silicon-chip-based ultrafast optical oscilloscope," Nature, vol. 456, No. 7218, pp. 81-84, Nov. 2008.

Gangopadhyay et al., "Analog Chirp Fourier Transform for high-resolution real-time wideband RF spectrum Analysis," 2011 IEEE International Symposium on Circuits and Systems (ISCAS), 2011, pp. 2441-2444.

Gupta et al., "Microwave Analog Real-Time Spectrum Analyzer (RTSA) Based on the Spectral-Spatial Decomposition Property of Leaky-Wave Structures," IEEE Trans. Microw. Theory Tech., vol. 57, No. 12, pp. 2989-2999, Dec. 2009.

Ishak, W.S., "Magnetostatic wave technology: a review," Proc. IEEE, vol. 76, No. 2, pp. 171-187, Feb. 1988.

Madami et al., "Direct observation of a propagating spin wave induced by spin-transfer torque," Nat. Nanotechnol., vol. 6, No. 10, pp. 635-638, Aug. 2011.

Meekins et al., "Optimization of the Rowland circle grating for high-resolution astrophysical spectrometers working at soft x-ray and EUV wavelengths," Appl. Opt., vol. 24, No. 18, p. 2987, Sep. 1985.

Meijer, F.G., "A high-resolution vacuum ultraviolet spectrometer for plasma spectroscopy," Meas. Sci. Technol., vol. 10, No. 5, pp. 367-373, May 1999.

Murmann, B., "ADC Performance Survey 1997-2015," [Online]. Available: http://web.stanford.edu/~murmann/adcsurvey.html.

Olsson et al., "A Method for Attenuating the Spurius Responses of Aluminum Nitride Micromechanical Filters," Microelectromechanical Systems, Journal of, vol. 23, No. 5, pp. 1198-1207, Oct. 2014.

Serga et al., "YIG magnonics," Journal of Physics D: Applied Physics, vol. 43, No. 26, p. 264002, Jul. 7, 2010.

Saperstein et al., "Demonstration of a microwave spectrum analyzer based on time-domain optical processing in fiber," Opt. Lett., vol. 29, No. 5, p. 501, 2004.

Schwartz et al., "An Electronic UWB Continuously Tunable Time-Delay System With Nanosecond Delays," IEEE Microwave and Wireless Components Letters, vol. 18, No. 2, pp. 103-105, Feb. 2008.

\* cited by examiner

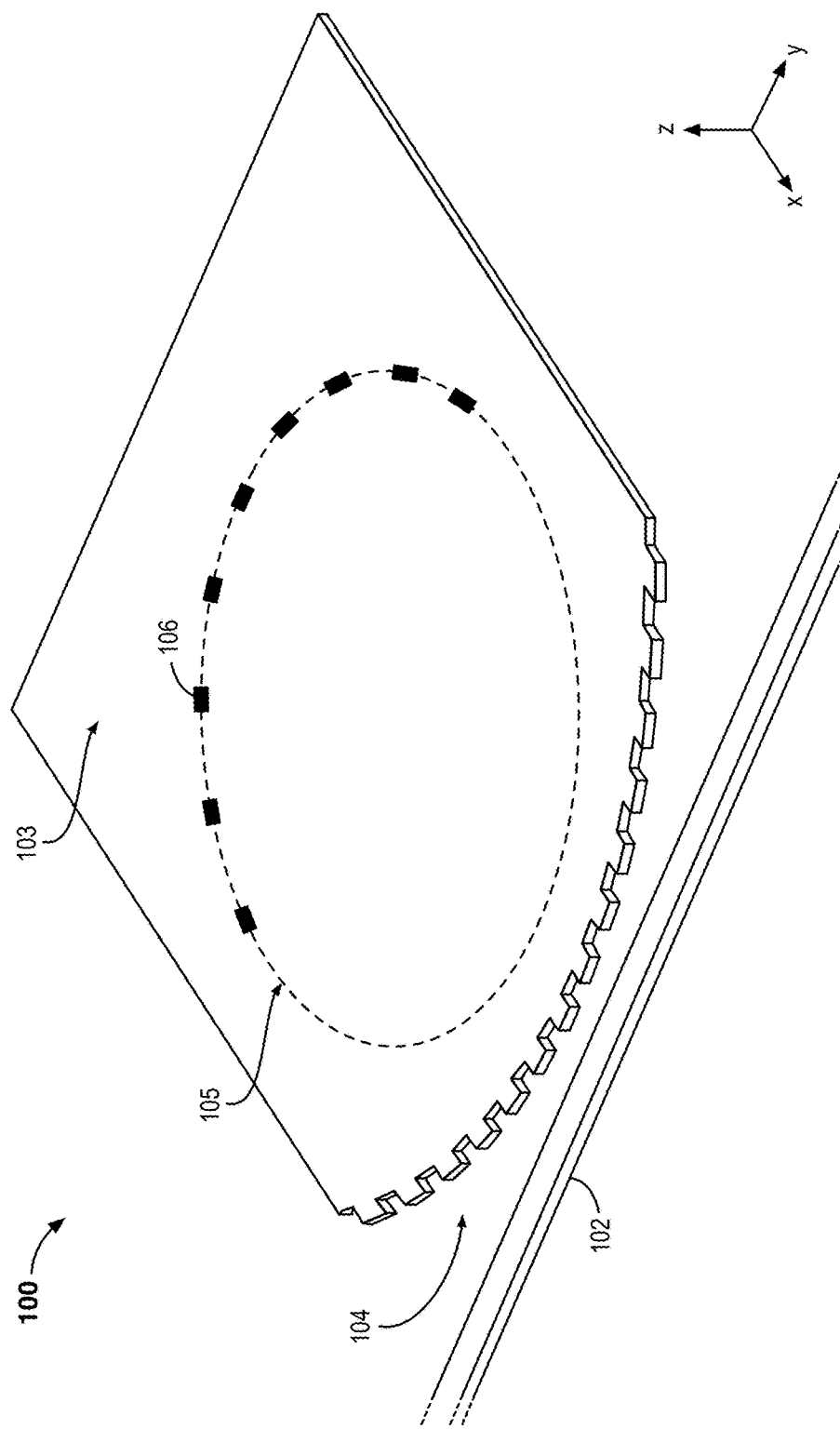

METHODS AND APPARATUS FOR SPIN WAVE-BASED SPECTRUM ANALYZERS

CROSS REFERENCE TO RELATED APPLICATION

This application is a non-provisional application claiming priority from U.S. Provisional Application Ser. No. 62/298,422 filed Feb. 22, 2016, entitled "Spin-Wave-Based Microwave Spectrum Analyzer" and incorporated herein by reference in its entirety.

GOVERNMENT LICENSE RIGHTS

This invention was made with government support under NEB 2020 1124850 awarded by the National Science Foundation. The government has certain rights in the invention.

FIELD OF THE DISCLOSURE

The present description relates generally to signal processing, more specifically the use of spin-wave interference in thin magnetic films to achieve spectrum analysis.

BACKGROUND OF RELATED ART

Microwave spectrum analysis is often times an important capability in some research laboratories, production environments, telecommunications, and electronic warfare systems. Due to the relatively long wavelength of microwave signals (centimeter range), and due to the fact that it is challenging to fabricate high-quality on-chip inductors and filters at higher frequencies, it remains challenging to fabricate fast, power efficient, and high resolution spectrum analyzers in a compact size.

Various methods currently exist to perform spectrum analysis in either the time domain or the frequency domain. High-speed analog to digital converters (ADCs) are often used to perform time domain sampling of high-speed microwave signals. However, gigahertz-rate ADCs consume several watts of DC power and baseband computational complexity to perform time-frequency conversion (e.g., FFT) is typically order N log N. For this reason, analog Fourier transform circuits have been conceived to work directly on the time-domain signal, obviating the need for high-speed sampling and domain transformation processing. The input signal is converted from the time-domain to the frequency domain directly in the analog circuit via either dispersive structures, such as a non-uniform transmission line, or time delay correlators. Because the frequency resolution is proportional to the total time delay in these methods, structures tend to be very large due to the very high propagation velocity of electromagnetic waves. Typical media include spiraled non-uniform transmission lines or spools of fiber accompanied by electro-optic conversion and opto-electric conversion.

Alternative methods of performing spectral analysis, such as the pervasive spectrum analyzer, are in the frequency domain. Some benefits of frequency domain processing include high frequency resolution and large dynamic range, without the need for a high-speed sampling. However, spectrum analyzers typically requires a local oscillator operating at frequencies commensurate with the microwave signals of interest, a nonlinear down-converter (e.g., a mixer), and significant filtering at the RF and at intermediate frequencies. Because such a configuration yields very high frequency resolution and high dynamic range spectral analysis, the spectrum analyzer is a mainstay instrument in microwave laboratories. However, it consumes significant power and space. Previous chip-scale spectrum analyzers rely upon shrinking each of the components of their larger counterparts for realization in a monolithic integrated circuit. In these shrunken spectrum analyzers, the filter bank proves to be the most challenging component to miniaturize due to the lack of high-quality on-chip resonant structures. MEMS-based filter banks have been demonstrated to achieve high quality on-chip filtering; however they are subject to the shortcomings of MEMS-based technologies such as reliability and high bias voltages. Even without these MEMS-specific issues, the architecture of typical chip-scale spectrum analyzer consumes significant power, regardless of the filtering technology.

One weakness of time domain processing, such as sampling with high-speed ADCs and then performing time-frequency conversion in digital processing, is the high power and limited sample rate, thus limiting the maximum operating frequency of digital time-domain processing-based spectrum analyzers. Analog time-domain processing-based spectrum analyzers solve the problem of power and maximum operating frequency, but are often large in size. A weakness of frequency domain processing devices is their size and power (specifically the size of the filter banks). Even chip-scale spectrum analyzers, which have miniaturized the filter banks, suffer from high power requirements.

BRIEF DESCRIPTION OF THE DRAWINGS

FIG. 1A is a perspective view of an example spin wave-based spectrum analyzer.

DETAILED DESCRIPTION

Figure 1B:
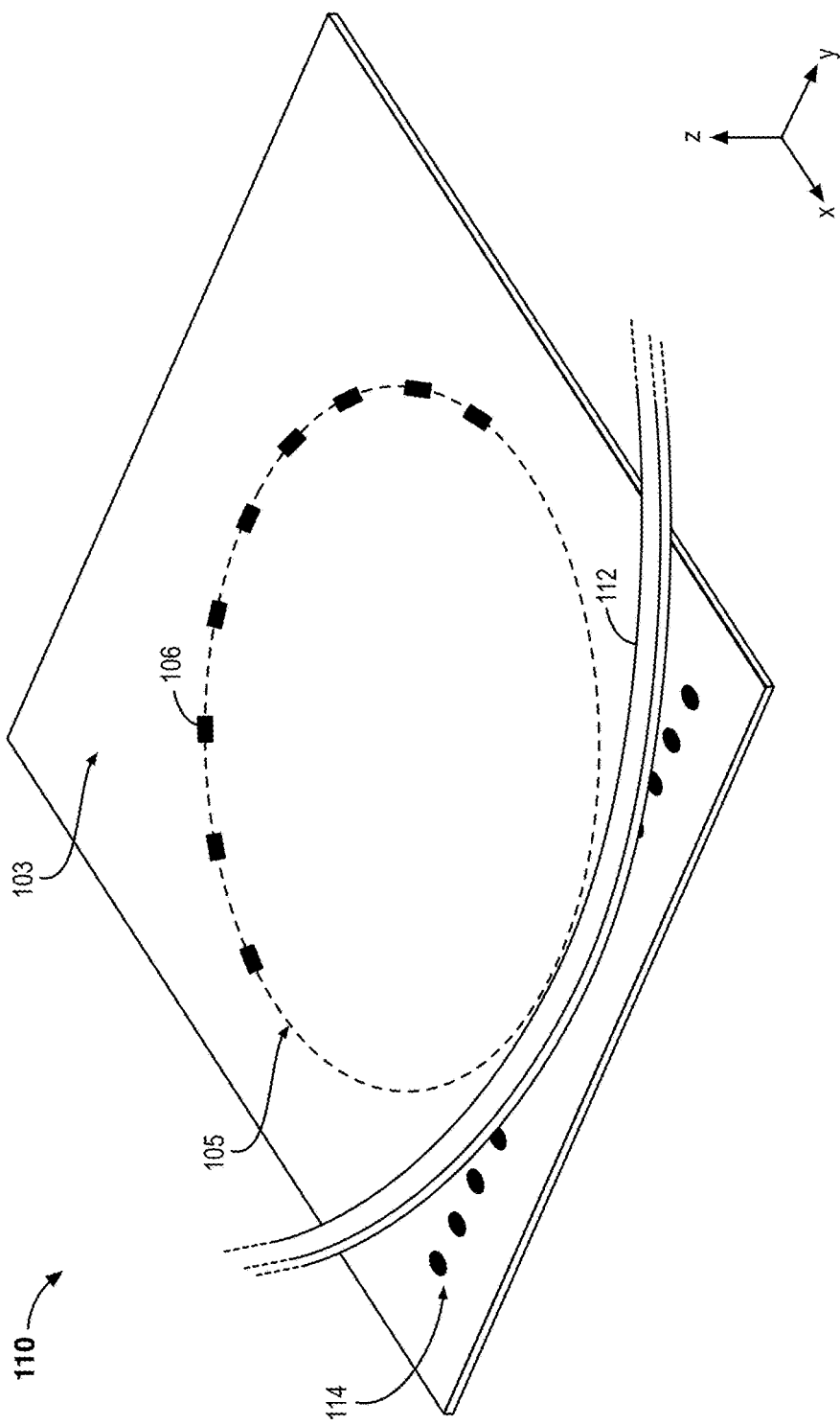
FIG. 1B is another perspective view of an example spin wave-based spectrum analyzer.

The following disclosure of example methods and apparatus is not intended to limit the scope of the disclosure to the precise form or forms detailed herein. Instead the following description is intended to be illustrative so that others may follow its teachings.

Spectrum analyzers generally refer to devices that measure properties of electrical signals or waves. Some spectrum analyzers can measure the relative power levels of different wavelengths from a source signal, such that dominant frequencies can be identified from the source signal. In the radio-frequency domain, the ability to decompose a signal into its spectral components has led to the creation of complex wireless communication schemes. In the optical-frequency domain, analyzing the relative power of different light wavelengths is useful in fiber-optic communication and detecting atomic spectra.

A common spectrum analysis technique involves time-domain sampling of an input signal and converting that time-domain data into frequency-domain data using mathematical or computational techniques (e.g., Fourier transforms). Although algorithms, such as fast Fourier transforms, or FFTs, have increased the speed and efficiency of time-to-frequency domain conversions, such algorithms consume valuable computing time, memory, power, and have accuracies dependent upon the floating point precision of the processors on which the algorithms are performed.

In the optical realm, physical processes such as refraction and interference can be used to facilitate spectrum decomposition without any time-to-frequency computing steps. As a simple example, a prism can spatially disperse light into its constituent wavelengths using refraction. The brightness of each color of light at the output is indicative of the relative power of those wavelengths of the light source. In the classic double-slit experiment, photons passing through two slits in a grating interfere with each other, casting an interference pattern on a screen. The resulting locations on constructive and destructive interference can be measured to determine the wavelength of the light source.

The present application discloses a spectrum analyzer that utilizes spin wave interference to conduct spectrum analysis. The example spectrum analyzers disclosed herein are fast (acting on all spectral components simultaneously), energy efficient, compact (in some instances micrometer-sized) and can be integrated on a chip. An example device includes a thin magnetic film in which small wavelength (e.g., a few hundreds of nanometers to a few micrometers) spin waves are induced. The magnetic film may initially be saturated by an applied magnetic field, preferably in perpendicular direction on the film to avoid anisotropic wave dispersion. The wavelength of the produced spin waves depends on their frequency and the external biasing field; thus different frequency components of a signal launch spin waves with different wavelengths. The separation of the frequency components is accomplished by a concave grating (e.g., shaped as an arc of a circle with radius 2R), which diffracts the spin waves with different wavelengths to different directions. The concave shape of the grating also focuses spin waves of different wavelengths to corresponding points on a Rowland circle (the circle with radius R tangent to the center of the grating). The spin-wave source might be a point source on the Rowland circle, or an arc shaped source behind the grating with the center on the Rowland circle. Alternatively, the spin-wave source might be the grating itself, consisting separate point sources on a circle with the distance between the sources being the grating periodicity.

Referring now to the figures, FIG. 1A illustrates a perspective view of an example spin wave-based spectrum analyzer 100. The spectrum analyzer 100 includes an antenna 102, a magnetic film 103 with a concave patterned edge 104, and sensors, such as sensor 106, positioned along a Rowland circle 105. In an example operation, a source signal (not shown) is injected into the antenna 102, producing a magnetic field that couples with the concave patterned edge 103 to generate spin waves. The arced shape at the concave patterned edge 103 causes the spin waves to interfere creating a focus at one or more points along the Rowland circle 105. The sensor 106 is positioned at a location corresponding to a focal point of particular wavelength of the spin waves. The sensor 106 is configured to measure a property of the magnetic film or spin waves propagating therethrough, which may then be converted by the sensor into a voltage, current, other electric signal. The measurement output by the sensor 106 can then be processed and correlated with, for example, a power level of a wavelength of the source signal based on a known relationship.

The antenna 102 may be any type of conductive material that, when energized by a current (e.g., from a source signal), produces a magnetic field around the antenna 102. In this example, the antenna 102 is placed laterally adjacent and substantially coplanar with the magnetic film 103 such that an induced magnetic field interacts with a portion of the magnetic film 103, such as the concave patterned edge 104 shown in FIG. 1A. In other examples, the antenna 102 may be situated above or below the magnetic film 103 (normal to the magnetic film 103), and may be disposed closer or further away from the concave patterned edge 104 than is illustrated in FIG. 1A. The arrangement of the antenna 102 with respect to the magnetic film 103 may depend upon the amount of power injected into the antenna 102 (and thus the strength of the magnetic field produced by the antenna 102). Although the antenna 102 depicted in FIG. 1A is shown to be straight, other antennas may take on other shapes, such as arcs of circles. Other antenna geometries are also possible.

The magnetic film 103 may be any type of thin ferromagnetic or ferrite film. In this example, the magnetic film 103 is a ferrite YIG film. Different types of magnetic films may possess different properties and therefore result in different design considerations. For example, ferromagnetic films may exhibit relatively high amounts of damping, such that spin waves propagating through the magnetic film 103 attenuate over distance. In these configurations, the magnetic film 103 may need to be relatively small in size so that the spin wave properties have a large enough magnitude to be detected and accurately read out. On the other hand, ferrite films (e.g., YIG films) may exhibit relatively lower amounts of damping, such that spin waves can propagate through hundreds or thousands of cycles and still maintain a large enough magnitude to be measured with adequate accuracy.

The concave patterned edge 104 may be shaped substantially as an arc of a circle, with a serrated or patterned edge. The alternating protrusions or teeth of the patterned edge 104 may cause an initial phase shift between spin waves generated at the outer portions compared to spin waves generated at the inner portions of the concave patterned edge 104. The concave shape of patterned edge 104 may also act as a magnetic analog of a lens, focusing the spin waves to different focal points on the magnetic film 103. More specifically, the example concave shape of patterned edge 104 causes a set of spin wave wavelengths to be focused by interference and converge at a respective set of locations on the magnetic film 103. These locations form the Rowland circle 105, and sensors may be placed along the circumference of The Rowland circle 105 in order to measure properties of spin waves focused at points along the Rowland circle 105.

The sensor 106 may be situated above, below, on, or in the magnetic film 103 at or near points defined by the Rowland circle 105. Spin waves propagating through the magnetic film 103 cause secondary effects to occur, aspects of which can be measured using various sensing devices. Such sensing devices may be based on the spin Hall effect or inverse spin Hall effect, measuring generated currents or voltages produced by an accumulation of spin waves at a given point on the magnetic film. The sensor 106 can include multiple components, such as one or more sensing interfaces (e.g., electrode(s) or wire loops) and circuit components for amplifying, mixing, and sampling the read out voltage or current.

Properties of the focused spin waves along the Rowland circle 105 are indicative of properties of the source signal in the example analyzer 100. Based on the dimensions and arrangement of the components of the spectrum analyzer 100, the properties of the magnetic film 103, and the strength of any external biasing fields, the voltage and/or current measured at a point along the Rowland circle 105 may represent the relative power level of a particular wavelength of the source signal. The proportionality between the power level and the magnitude of the measured voltage and/or current at the sensor 106 may depend on the strength of the magnetic field generated at the antenna 102, the amount of damping caused by natural damping by the magnetic film material, and the distance between the concave patterned edge 104 and the sensor 106, among other possible factors. The relationship associating a specific point on the Rowland circle 105 with a corresponding wavelength is described in greater detail below.

FIG. 1A illustrates one example arrangement of elements to form a spin wave-based spectrum analyzer. However, other arrangements are also possible. For instance, both FIGS. 1B and 1C illustrate other example spin wave-based spectrum analyzers 110 constructed in accordance with the present disclosure.

Figure 1C:
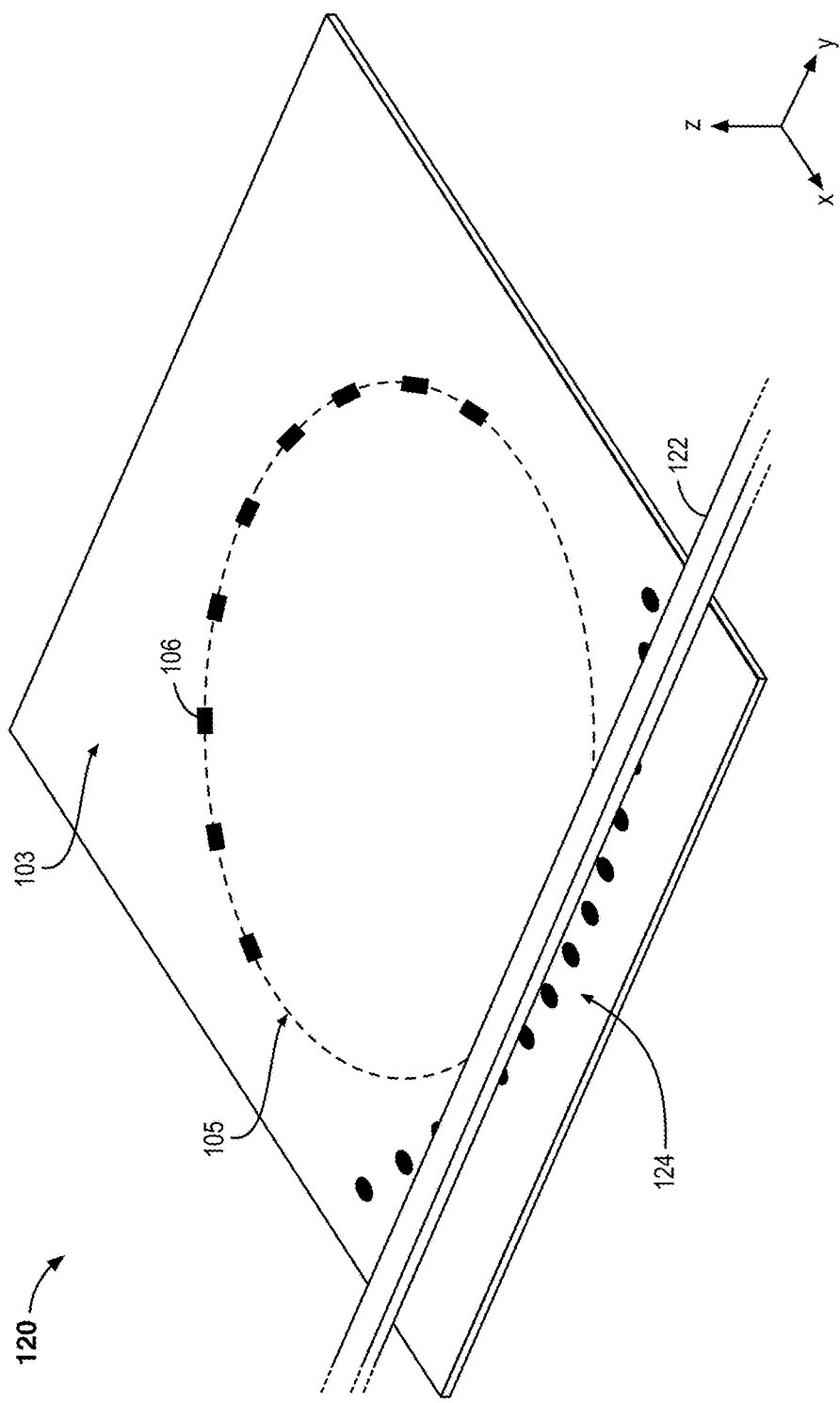
FIG. 1C is another perspective view of an example spin wave-based spectrum analyzer.

For the description of FIGS. 1A-1C, the magnetic film is coplanar to the x-y axis. In FIG. 1A, the antenna 102 extends substantially linearly in the y-direction, and is laterally disposed to the magnetic film 103 in the x-direction. The concave patterned edge 104 spans across the y-direction, and bows out in the x-direction. It should be understood that x-y-z designations described herein are provided for explanatory reasons only.

Similar to the spectrum analyzer 100, spectrum analyzer 110 includes a magnetic film 103 and sensors 106. However, unlike the spectrum analyzer 100, the spectrum analyzer 110 includes a curved antenna 112 that is disposed vertically (in the z-direction) above the magnetic film 103. Elements 114 are positioned beneath the curved antenna 112 in a substantially linear arrangement (in the y-direction).

The concave antenna 112 may be shaped as an arc of a circle having a radius that is twice that of the Rowland circle 105, similar to the concave patterned edge 104. Other shapes and geometries are also possible. The concave antenna 112 is operable to generate a magnetic field when energized by a source signal. As described herein, the concave antenna 112 is situated at an "end" of the magnetic film 103 (i.e., proximate to the elements 114) and is at some distance in the z-direction above the magnetic film 103. However, the concave antenna 112 may be situated at any x- or y-location above or below the magnetic film 103.

The elements 114 may be any feature of the magnetic film 103 or apparatus situated on or near the magnetic film 103 that interacts with the magnetic field produced by the concave antenna 112 to form spin waves. The elements 114 may be periodically spaced and in a substantially linear arrangement (in the y-direction). Some example elements 114 include holes in the magnetic film 103, nanomagnets, regions of material different from that of the magnetic film 103, regions across which separate localized magnetic fields are applied, fluctuations in the shape or structure of the magnetic film 103, or any other element that interacts with the magnetic field of the concave antenna 112 to produce spin waves.

During operation, the concave antenna 112 produces a magnetic field that couples with the magnetic film 103 and the elements 114 to produce spin waves. Similar to the spectrum analyzer 100, the spin waves propagating through the magnetic film 103 of spin wave analyzer 110 form a diffraction pattern and are focused at points along the Rowland circle 105. Due to the concave shape of the antenna 112, minor differences in spin wave phases at neighboring elements of the elements 114 causes the spin waves to interfere and form the diffraction pattern.

FIG. 1C also illustrates another example spectrum analyzer 120. Similar to the spectrum analyzer 100, the spectrum analyzer 120 includes a magnetic film 103 and sensors 106. Also similar to the spectrum analyzer 100, the spectrum analyzer 120 includes a substantially linearly shaped antenna 122; however, the antenna 122 is situated above the magnetic film 103 (in the z-direction) similar to the antenna 112 in FIG. 1B. Similar to the spectrum analyzer 110, the spectrum analyzer 120 includes elements 124. However, the elements 124 in the spectrum analyzer 120 are arranged in a concave shape, similar to the concave patterned edge 104 and/or the concave antenna 112. The elements 124 may be spaced apart periodically, and be any type of element as described above. The concave shape formed from the elements 124 may be an arc of a circle having a radius twice that of the radius of the Rowland circle 105.

During operation, the antenna 122 produces a magnetic field that couples with the magnetic film 103 and the elements 124 to produce spin waves. Similar to the spectrum analyzer 110, the spin waves propagating through the magnetic film 103 of spin wave analyzer 120 form a diffraction pattern and are focused at points along the Rowland circle 105. Due to the concave shape of the elements 124, minor differences in spin wave phases at neighboring elements of the elements 124 causes the spin waves to interfere and form the diffraction pattern.

As described herein, a "spin wave generator" generally refers to any apparatus or combination of apparatuses that collectively produces spin waves in a magnetic film. An example spin wave generator is the antenna 112 and an element of the elements 114. In this example, neighboring elements of the elements 114 produce spin waves at different phases in the magnetic film 103, such that two or more spin wave generators can collectively produce interfering spin waves that form a diffraction pattern.

An input signal (not shown), such as for example a microwave signal as is well known to one of ordinary skill in the art, may be injected into the antenna 102, which generates spin waves on the patterned edge of an adjacent magnetic film. The interference pattern created by the spin waves can be read out at specific locations using, in some embodiments, nanoscale loop antennas. The interference pattern is created in a way so that the frequency components of the signal becomes separated spatially.

New nanoscale computing devices often target power-efficient switches that could possibly replace CMOS devices for future circuits and keep Moore's law going. However, it is difficult to outperform CMOS devices in all aspects of merit. Sub-threshold CMOS devices could be extremely power efficient, albeit relatively slow. In this disclosure, it is shown that high-speed and low-power special-purpose processing may be an application area where spin waves may significantly outperform electrical-circuit-based solutions. Devices and techniques described herein exemplify a non-Boolean computing primitive—a special-purpose computing task, which is not computationally universal, but can be immensely useful in many applications.

The principles of operation of the spectrum analyzers described herein could be used to for other special-purpose processing devices, such as Fourier transformation, filtering, and holographic pattern matching chips, among other possible application. Removing the steps of converting between the time domain and frequency domain allows for high-speed and low-power processing, which could be integrated into chips or other processing devices.

As described herein, "spin waves" refer to propagating disturbances in the molecular ordering of magnetic materials. In a ferromagnetic or ferrite lattice structure, electrons of neighboring atoms magnetically interact with each other, such that a precession in the spin of one electron induces the precession in the spin of the neighboring electron. The interaction of neighboring electrons produces a net effect of a "spin wave" propagating through the lattice. The behavior of a spin wave may depend on the nature of the magnetic field that initially perturbed the electron spins, properties of the material forming the magnetic lattice structure, and the existence and strength of a biasing magnetic field, among other possible factors. As a result, the amplitude, frequency, and damping of propagating spin waves may be very implementation-specific.

As described herein, an "antenna" may generally refer to any wire, cable, waveguide, microstrip, or transmission line that generates a magnetic film (also referred to as an Oersted field herein) when an electric current runs through the antenna. Antennas of the present disclosure may have various shapes and dimensions, depending the particular embodiment. The magnetic field generated by antennas described herein may couple to a portion of a magnetic film, producing spin waves thereon.

As described herein, a "grating" or "patterned edge" may refer to any dispersive element that focuses spin waves into a radial diffraction pattern. The terms "grating" and "patterned edge" may be used interchangeably herein. Such a grating may be formed as a set of serrations formed on an edge of a magnetic film.

As disclosed herein, "concave" or "convex" edges may generally describe structures that are substantially shaped as an arc of a circle. Any structure described as concave may, in some examples, be convex, and vice versa depending on the point of reference. In general, edges described herein are "concave" to the extent that waves output at the concave edge are focused and converge; conversely, edges described herein are "convex" to the extent that waves output at the convex edge are spread apart and diverge.

As disclosed herein, a "property" of a spin wave or magnetic film may refer to any physical or measurable aspect of a spin wave or magnetic film at either a specific location or across two locations. For example, spin waves at a particular location may produce a magnetic field that can interact with adjacent conductors, such as a small loop antenna. The oscillating magnetic field produced by the propagating spin waves can induce a voltage on the loop antenna via the inverse spin hall effect (ISHE), which can be measured. Measuring a property of a spin wave or magnetic film may involve measuring either a property of the spin waves directly, or measuring a physical process (voltage differential, movement of charge in the form of current, etc.) that result from the propagation of spin waves in the magnetic film.

As disclosed herein, a "Rowland circle" refers to an imaginary circle drawn tangent to a surface of a magnetic film defining a set of points at which spin waves (generated at a concave diffraction grating) of different wavelengths are focused. The Rowland circle may share a point along its circumference with a center of a diffraction grating (see, e.g., FIG. 2). In some examples, the Rowland circle is not a physical element, but rather defines a set of possible locations on a magnetic film that are associated wavelengths of a source signal (see, e.g., FIG. 4). Thus, it should be understood that any depictions and descriptions of a Rowland circle may refer a set of positions on a magnetic film, and not necessarily a physical circular structure.

Signal processing devices of the present application involve generating and detecting aspects of spin waves propagating through magnetic films. A signal may first be converted into spin wave excitations, which propagate in a patterned magnetic thin-film. An interference pattern is formed in the film and its intensity distribution at the read-out points results in the spectral decomposition of the signal. Analytic calculations and micromagnetic simulations can be used to verify and to analyze the operation of the device. Such magnetoelectric devices (speed, area, power consumption) are potentially orders of magnitude better than what is achievable in a purely electrical system at room temperature. Spin wave-based techniques of the present disclosure may lead to new classes of low-power, high-speed, special-purpose signal processors.

Spin wave magnetic excitations are among of the most promising "alternate state variables" in electronics, due to their potentially very low energy, short wavelength and high speed. A number of proposals and/or device demonstrations use spin waves for realizing Boolean logic gates or non-Boolean computing primitives. The present disclosure describes a device and application area for spin waves. Spin waves are very well-suited for high-frequency and compact spectrum analyzer devices. Spectrum analyzers described and shown herein illustrate how concepts from non-Boolean, optical devices can be applied in the domain of spin waves, which could be much more amenable to chip integration than light wave-based alternatives.

Techniques described herein involve converting microwave signals into spin wave excitations. The Oersted field of a simple waveguide can generate a coherent spin wave wavefront in a magnetic thin-film. The signal processing takes place in the spin wave domain, via interference, and the resulting interference pattern can be detected electrically at the output. An example spin wave based processor is illustrated in FIG. 1A. The wavelength of the spin waves may be two to six orders of magnitude shorter than the input microwave wavelength at the same frequency, so switching to the spin wave domain could enable very compact devices. The spin wave wavefront carries energy that is about three orders magnitude less than the energy of the generating microwave signal, potentially resulting in very low-energy processing. Spin wave signals generally do not suffer from parasitic capacitive or inductive couplings, and the low magnetic damping of ferrite thin-films allows high signal integrity. The spectral analysis can be accomplished by spin-wave interference pattern formation and detection. In effect, the interference pattern on the patterned film is functionally similar to a filter bank, made of high-Q factor LC components.

Microwave spectrum analysis is an important capability in today's telecommunications and electronic warfare systems, as well as in many data processing applications. Due to the relatively long wavelength of microwave signals (centimeter range) and due to the fact that it is challenging to fabricate high-quality on-chip inductors and filters at higher frequencies it remains challenging to fabricate fast, power efficient and high resolution spectrum analyzers in a compact size. Digital spectrum analyzers can be made much more compact then passive ones, but they require high-speed analog-digital converters (ADCs)—such ADCs consume several watts of DC power. Frequency-domain processors, MEMS-based systems face similar challenges.

On-chip interference-based processors, which use lumped LC elements to perform spectral analysis, also suffer from relatively large serial parasitic resistance of the inductors. Thus, such processors are difficult to scale to large sizes and consume a substantial amount of power. In contrast, the spin wave-based devices of the present disclosure do not experience such parasitic resistance, and thus can maintain low power consumption and various sizes.

A spin wave-based spectrum analyzer may include a concave grating that serves to both (1) create a diffraction pattern and (2) focus the waves. Concave gratings used may be magnetic functional analogs of gratings typically used in optical and x-ray spectroscopy (e.g., Rowland circle spectrographs). Concave gratings offer several advantages over conventional flat gratings by eliminating the need for lenses in the system, which are often difficult to realize outside the optical domain.

Figure 2:
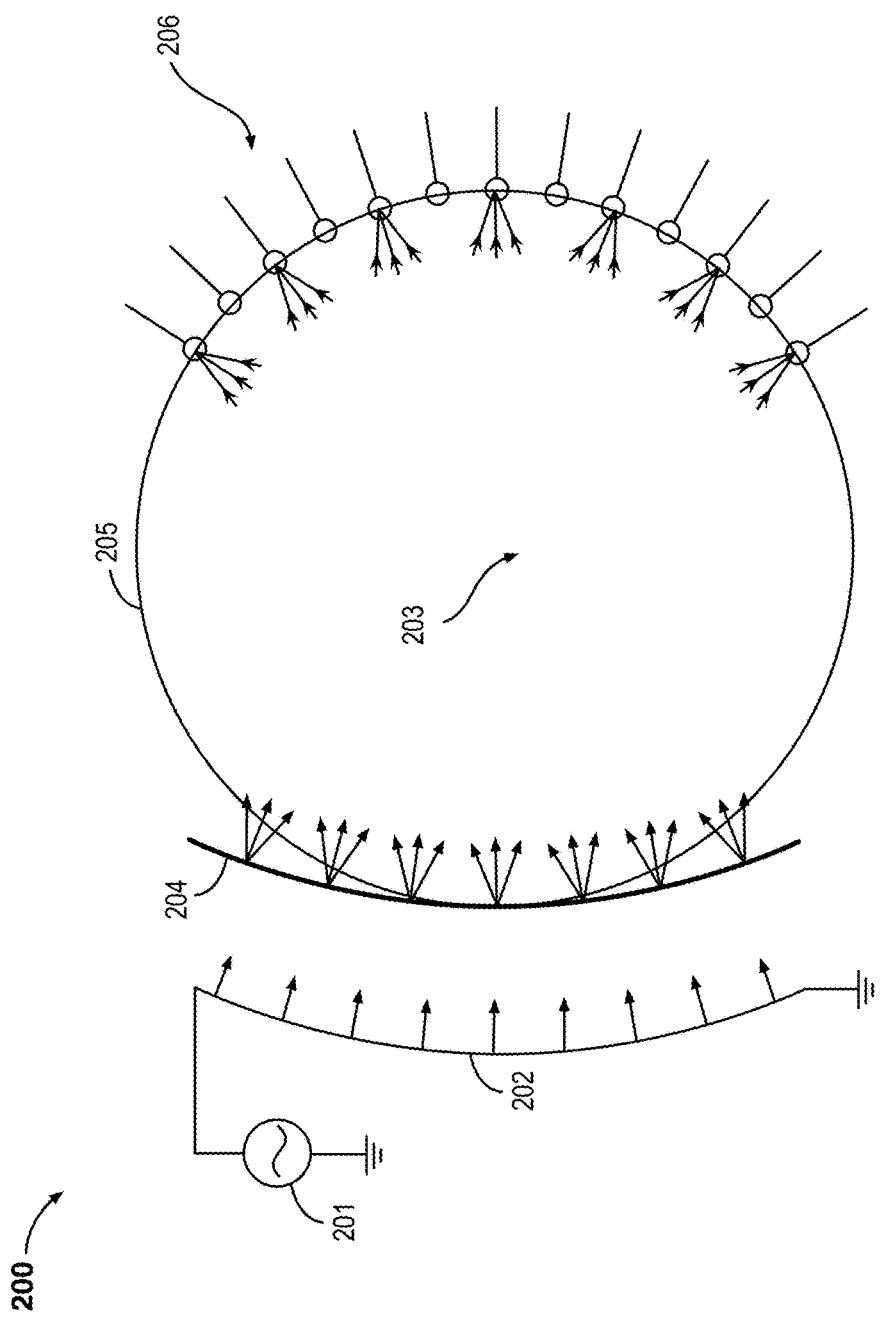
FIG. 2 is a top-down view of a conceptual drawing of the example spin wave-based spectrum analyzer, according to an example embodiment.

FIG. 2 depicts a top-down view of a conceptual drawing of a spin wave-based spectrum analyzer 200. The spectrum analyzer 200 includes a signal source 201 electrically coupled with antenna 202 for producing a magnetic field. The spectrum analyzer 200 also includes a magnetic film 203 with a concave patterned edge 204 that interacts with the magnetic field and generates spin waves that propagate through the magnetic film 203 toward the sensors 206. The sensors 206 are situated at locations at or near the circumference of Rowland circle 205.

The signal source 201 drives the spin wave-generating antenna 202 (e.g., a microstrip antenna or waveguide). The magnetic field generated by antenna 202 produces spin waves in the magnetic film 203, and the spin waves propagate through the concave grating 204. The spin waves pass through the slits of the grating interfere on the other side of the grating in such a way that different frequency components are focused to separate locations on the Rowland circle 205. Thus, by placing the spin-wave sensors 206 on the Rowland circle it is possible to read out the corresponding frequency components of the input signal. Increasing the radius of the concave grating 204 increases the separation between the spectral components, although attenuation of the spin waves due to the damping mechanism in magnetic materials may limit the ultimate frequency resolution.

The device can be made from a number of metallic ferromagnetic films (such as Permalloy, CoFe) or ferrites (such as YIG). Since YIG has one of the smallest damping coefficients among magnetic materials, it is widely used in magnonic applications as well as in microwave filters. Good quality YIG films may have two to three orders of magnitudes lower damping coefficients than metallic ferromagnets, which enables spin-wave propagation to several micrometers. This is still small compared to microwave wavelengths, but enables signal procession due to the relatively small wavelengths of spin waves (few hundred nanometers) at microwave frequencies. The device produces an instantaneous spectrum on the input signal with only a few nanosecond delay (depending on the magnetic film material and size), thus enabling rapid time-frequency analysis.

Magnetically tunable high quality oscillators can be made out of YIG (yttrium-iron-garnet) spheres with size under a millimeter. Using YIG, filter banks and channelizers can be built, and exploiting the nonlinear property of the magnetic waves, frequency selective limiters have been demonstrated. Circulators and isolators may use ferrites, such as YIG. These devices, however, do not use magnetic excitations to actually carry information—rather, they use the magnetic materials as tunable permeabilities, exploiting the interaction of guided waves and magnetic excitations Spin waves in thin magnetic films can be generated in a number of ways, including a microstrip or coplanar waveguide antenna, spin-torque structures, electric-field-driven multiferroic magnetoelectric cells, or using spin hall effect (SHE). The readout is also possible using antennas, giant magnetoresistance (GMR), or inverse SHE, among other possible measurement techniques.

Figure 3:
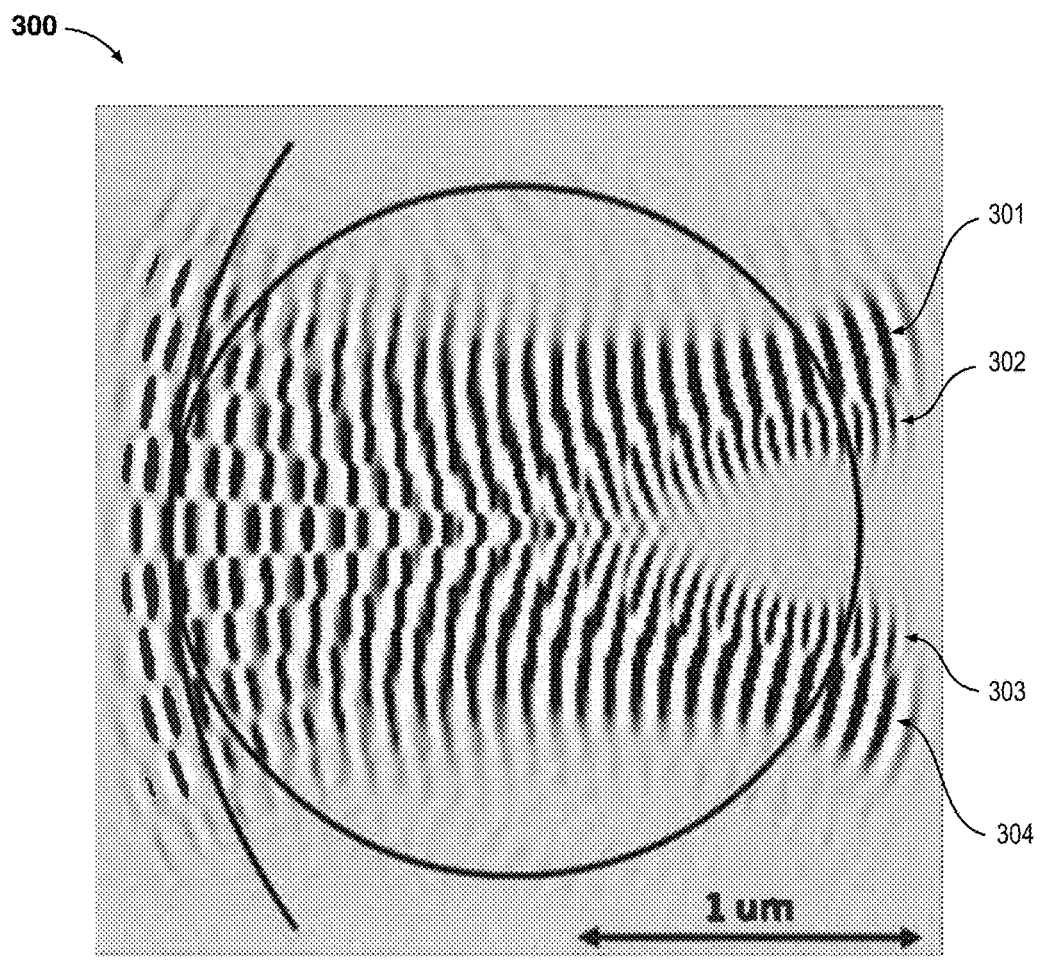
FIG. 3 is a graphical representation of an example spin wave interference.

FIG. 3 depicts a micromagnetic simulation output 300 of a spectrum analyzer (such as spectrum analyzer 100 or spectrum analyzer 200), with simulated spin-torque point sources distributed along an arc realizing both input and concave grating. The input signal consists of two frequency components, 10 GHz and 20 GHz. It is clearly visible that the two frequency components with different wavelengths are focused in to separate locations on the Rowland circle. In FIG. 3, the interference of spin waves produces four lobes, with each lobe corresponding to a frequency component. In this example, lobes 301 and 304 correspond to 20 GHz, and lobes 302 and 303 correspond to 10 GHz. Note, that the separation is relatively small due to the small radius of the grating in this particular simulation; other implementations may include different magnetic film sizes and concave patterned edge dimensions, thereby increasing the spatial resolution of the interference pattern.

Figure 4:
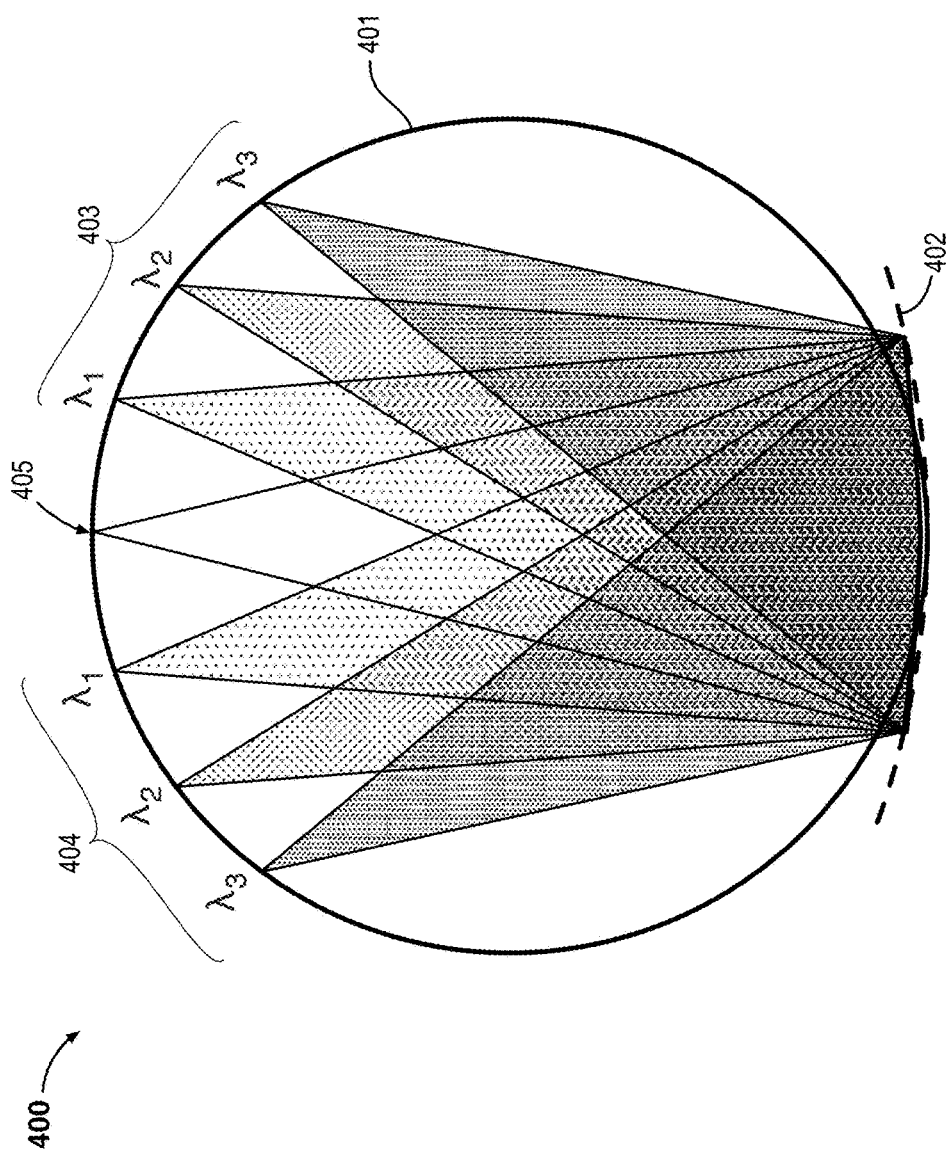
FIG. 4 is a conceptual drawing of an example Rowland spectrograph.

In FIG. 4, a multispectral time-domain signal excites the grating and the wavefronts interfere in such a way that the spectral decomposition of the signal appears on the Rowland circle. The sketch 400 of a generic Rowland circle 401 spectrograph shown in FIG. 4 includes a curved grating at the bottom of the device, which diffracts spin waves with different wavelengths along different directions, and—due to its concave shape—also focuses them to different points on the Rowland circle, as depicted by the circles along the right side of the Rowland circle in FIG. 4. Since the wavelength depends on the excitation frequency, different frequency constituents of a time-domain signal launches waves with different wavelengths. So if a signal with multiple time-domain spectral components is launched from the grating, then the intensity distribution along the Rowland circle gives the spectral decomposition of this signal.

In FIG. 4, a time-domain signal having wavelengths $\lambda_1$, $\lambda_2$, and $\lambda_3$ is used to produce spin waves at the concave patterned edge 402. As shown in sketch 400, each of the wavelengths $\lambda_1$, $\lambda_2$, and $\lambda_3$ constructively interfere at respective locations 403 and 404 along the Rowland circle 401.

Figure 5:
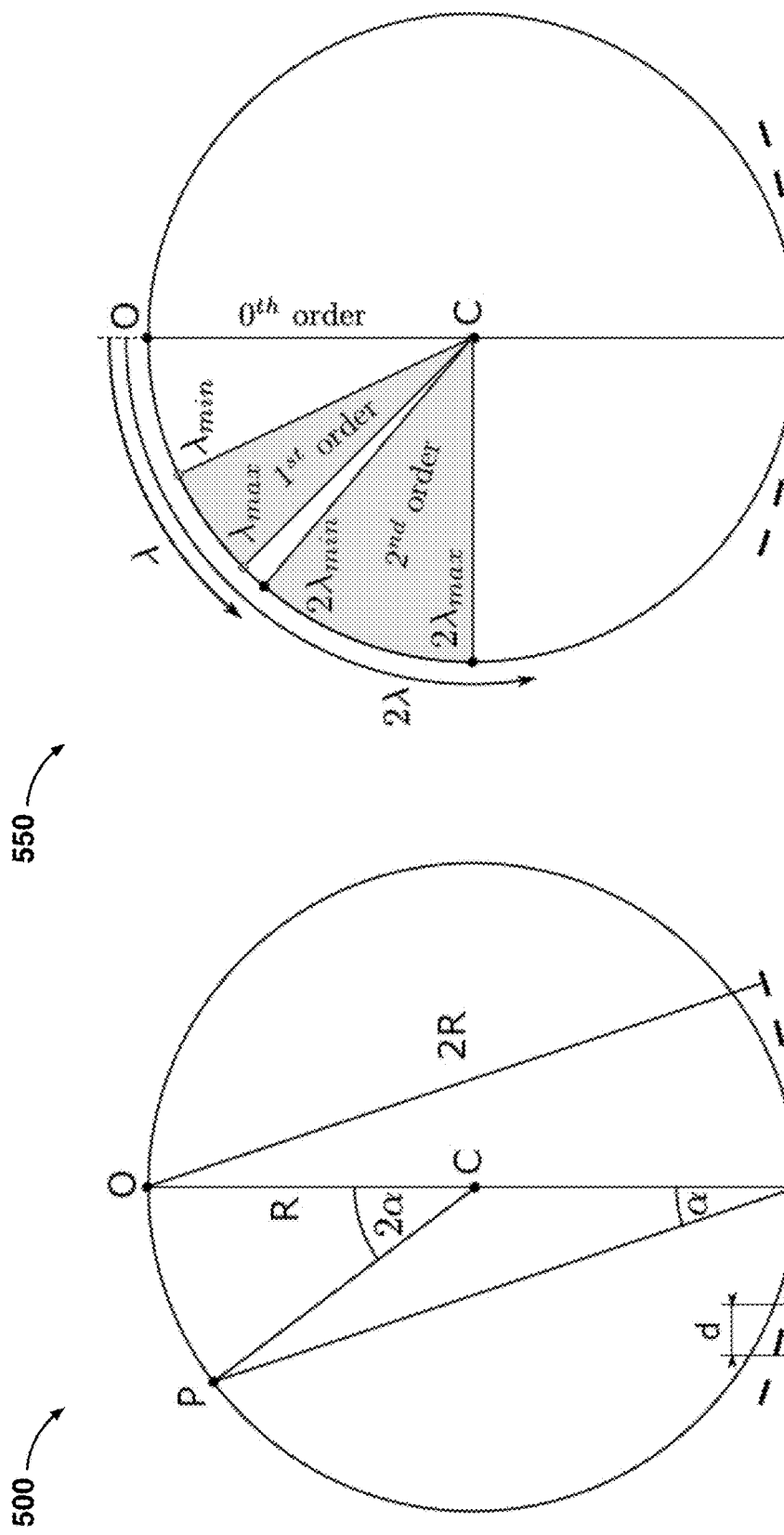
FIG. 5A is a conceptual diagram illustrating a calculation of a resolution of an example Rowland circle.
FIG. 5B is a conceptual diagram illustrating positions of diffraction orders around a Rowland circle.

Broadly speaking, FIG. 4 is a general sketch of the operating principles of a Rowland spectrograph. The source of waves in the sketch 400 is through the grating 402. The sketch illustrates how different frequency components are focused at respective locations along the Rowland circle. Each of the wavelengths $\lambda_1$, $\lambda_2$, and $\lambda_3$ is are focused at two points; in this sketch 400, there are six focal points (two for each wavelength) that collectively represent three spectral intensities. Due to the symmetric nature of the Rowland circle, there is a duplicate focal point for each wavelength $\lambda_1$, $\lambda_2$, and $\lambda_3$ (one within region 403, and another within region 404). The $0^{th}$ order term 405 conceptually represents a location where parts of the waves are focused regardless of their frequency (this is a byproduct of the operation of the device). Diffraction orders are depicted in FIG. 5B. The $2^{nd}$ order signals may not be measured, depending upon the implementation.

FIG. 5A is a conceptual diagram 500 illustrating a calculation of a resolution of a Rowland circle. The spectral resolution of the system depends on the separation of the spectral components on the Rowland circle. The deflection angle $\alpha$ (as seen on FIG. 5A) of a wave with wavelength, on a grating with grating constant d is given by the grating equation:

$$\sin\alpha = \frac{n\lambda}{d} \quad (1)$$

where n is the diffraction order. This formula is valid for flat gratings and a good approximation for gratings with small curvature, which is the case we consider here. In case of a concave grating, the deflection angle $\alpha$ is the same at every point on the grating and the waves with same wavelength are focused to a single point P on the Rowland circle (see FIG. 5A). It is easy to see that $\angle PCO=2\alpha$ so the length of the arc is:

$$\overline{PO} = 2R\arcsin\frac{n\lambda}{d} \quad (2)$$

Thus, for small angles the position of the focal point P on the Rowland circle depends approximately linearly on the wavelength. The resolution of the system can be engineered by choosing the appropriate Rowland circle radius, R. Note that any wave with a wavelength $\lambda \geq d$ has only the trivial zero order component.

FIG. 5B illustrates the location of the higher-order peaks around a Rowland circle. In the design of the spectrum analyzer, care should be taken to avoid the overlap between different diffraction orders and this limits the operation of the device to a frequency band between the corresponding $\lambda_{min}$ and $\lambda_{max}$ wavelengths. For correct operation the input signal cannot contain high frequency components with spin-wave wavelength less than $\lambda_{min}$, thus the input signal must be pre-processed (or post-processed) by a low-pass filter. The lowest frequency that can be distinguished without second order overlap corresponds to $\lambda_{max}=2\lambda_{min}$ In order to avoid band overlap, $\lambda_{max} < 2\lambda_{min}$ should be maintained.

The calculations presented above are wavelength-dependent and assume generic linear wave properties. To determine the spectrometer resolution in terms of frequency, it is important to know the dispersion relation (wavelength-frequency relation). For electromagnetic waves, there is usually a linear relation between wavelength and frequency, while spin waves have a more complex, nonlinear dispersion relation.

Magnetic materials can be thought as an assembly on interacting, elementary magnetic moments (i.e., spins). In a classical picture, a space and time-dependent, continuous magnetization distribution M(r, t) characterizes a ferromagnetic (or ferrimagnetic) material. The spins are coupled to each other via magnetostatic interactions and exchange interaction. Disturbances in the magnetization distribution propagate in a wave-like manner and are referred to as "spin waves" or "magnons." For small amplitudes (few degree deflection of the M vector) spin waves behave as linear waves to a good approximation.

There are also notable differences between spin waves and electromagnetic waves. The spin wave dispersion relation strongly depends on material parameters and externally applied magnetic fields and may be "engineered" by the appropriate choice of these parameters. Spin-wave wavelengths as small as a few nanometers to ten nanometers may correspond to microwave (5-100 GHz) frequencies. Spin-wave propagation is often anisotropic and the wavelength depends on the relative orientation of M magnetization and the k wave vector. Spin waves are strongly damped in most ferromagnetic metals, but they may propagate large distances (thousand times wavelength) in ferrites (such as yttrium iron garnet (YIG) or Barium ferrite (BaM)).

Spin-wave dynamics can be modeled by standard micromagnetic theory and a number of established software packages are available for this task. Some simulators solve the Landau-Lifshitz-Gilbert equations (LLG equations) in the time-domain. For certain spin-wave propagation modes and certain parameters one can often linearize the LLG equations and/or find analytical solutions for the dispersion relation.

As an example, we consider dispersion relation for spin waves in a magnet that is magnetized along the $\hat{z}$ direction:

$$\omega = \sqrt{(\omega_0+\omega_M\lambda_{ex}k^2)(\omega_0+\omega_M(\lambda_{ex}k^2+\sin^2\theta))} \quad (3)$$

where $$\omega_0 = \gamma\mu_0 H_0, \quad \omega_M = \gamma\mu_0 M_S, \quad \lambda_{ex} = \frac{2A_{exch}}{\mu_0 M_S^2},$$

$\gamma$ is the gyromagnetic ratio, $\mu_0$ is the vacuum permeability, $M_S$ is the saturation magnetization, $H_0$ is the total internal field, $A_{exch}$ is the exchange coefficient, k is the wavenumber, and $\theta$ is the angle between the propagation direction and $\hat{z}$.

It is possible to distinguish between two fundamentally different propagation modes of spin waves. For waves with large k (short wavelength) the term $\lambda_{ex}k^2$ in Eq. 3 is much smaller than one and is negligible compared to the other terms. Waves in this parameter regime are called exchange waves because the dominant interaction mechanism between oscillating spins is the exchange interaction. On the other hand, if $\lambda_{ex}k^2 \gg 1$ (long wavelength), then the dipole interactions dominate, and such waves are called dipole spin waves or magnetostatic waves. Exchange-waves have several orders of magnitude shorter wavelengths compared to electromagnetic (EM) waves at the same frequency, but even magnetostatic wave wavelengths are at least two orders of magnitude shorter than EM wave wavelengths. This makes spin waves attractive to use in compact (e.g., on-chip) applications.

The dispersion relation of Eq. 3 depends on the angle $\theta$ between the direction of wave propagation and the magnetization. This dependence yields to anisotropic wave propagation for in-plane magnetized films, but not in out-of-plane films, since in that case the out-of-plane (normal) vector is perpendicular to every wave vectors in plane. In the following description, we assume out-of-plane magnetized films in order to avoid complications that arise from anisotropic propagation; however, it should be understood that other magnetization schemes are possible without departing from the scope of the present application.

Figure 6:
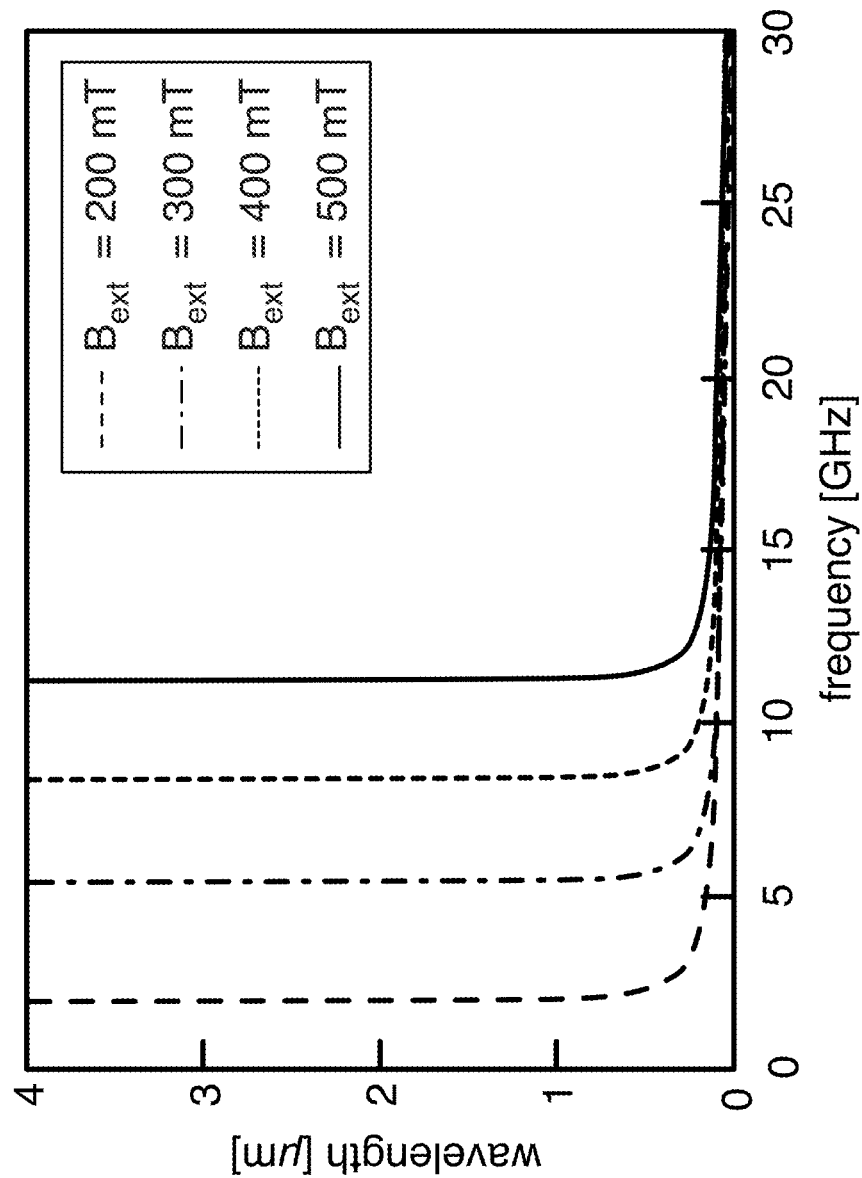
FIG. 6 is a graph of a calculated dispersion relation of spin waves in an out-of-plane magnetized yttrium-iron-garnet (YIG) film at different external field strengths.

The description and equations above show that in the Rowland configuration there is an approximately linear mapping between wavelength and the location of the corresponding focus point on the Rowland circle (Eq. 2). In order to determine the mapping of frequencies, FIG. 6 shows calculated dispersion curves in a thin YIG film at various $B_{ext}$ external fields. It is possible to set $B_{ext}$ so that the frequency band of interest falls on a higher or lower slope of the dispersion curve. By doing so, it is possible to achieve a narrow-band spectrometer with high frequency resolution, or wide-band spectrometer with lower resolution while other design parameters remain unchanged.

As a concrete example, assume d=4 μm and R=1 mm. The first order peak of a $\lambda_1$=1 μm spin wave is focused at $\tilde{r_1 0}$ =505.4 μm. The wavelength of a wave focused in the next output point at $\tilde{r_2 0}$ =501.4 μm has a wavelength $\lambda_2$=0.992 μm. If a bias field $B_{ext}$=300 mT were applied, these wavelengths w correspond to $f_1$=5.465 GHz and $f_2$=5.466 GHz, i.e. a frequency resolution of Δf=1 MHz corresponds to a l=4 μm distance on the Rowland circle.

Magnetic damping caused by the magnetic film may limit the spin-wave propagation length and diminish signal integrity. YIG has one of the lowest damping among the known magnetic materials, with damping coefficient as low as $\alpha=2.3\times10^{-4}$ and decay lengths of up to thousand wavelengths. This device in the above numerical example is realizable with reasonably strong spin-wave signal reaching the Rowland circle.

In a Rowland-circle spectrograph, an optical or x-ray beam is directed to the grating, which acts as a secondary source of waves. In the case of spin waves, the grating can be made the primary source of the waves. FIG. 6 illustrates calculated dispersion relation of spin waves in an out-of-plane magnetized YIG thin film, assuming four different external fields.

FIG. 6 is a graph of a calculated dispersion relation of spin waves in an out-of-plane magnetized yttrium-iron-garnet (YIG) film at different external field strengths. The curves shown in FIG. 6 can be mathematically determined using Eq. 3 above. The slope of the curve is directly related to the spectral sensitivity of the device and may be tuned for specific applications. In this example, the external field $B_{ext}$ is a constant uniform magnetic field used to saturate the magnetization, which might be generated by a permanent magnet. In some implementations, the magnetic field may be generated via a coil or other tunable or adjustable magnetic field generator. Depending on the implementation, $B_{ext}$ can be a design parameter and controlled in order to change the frequency band of operation of the spin wave-based spectrum analyzer.

In some instances, a controllable $B_{ext}$ can allow a spectrum analyzer to scan across various frequencies as desired. By adjusting $B_{ext}$ during operation, statically placed sensors along a Rowland circle can correspond to different wavelengths. By adjusting the external biasing field, the nature of the spin wave dispersion changes, allowing a solid state device to read out different frequencies without having to change the location of spin wave sensors or detectors.

FIG. 6 shows that the nature of the diffraction pattern depends upon the strength of an external biasing magnetic field. A spin wave-based spectrum analyzer can include controllable magnetic field generators to apply different biasing magnetic fields over time. Such implementations can therefore implement a "sweep" mode of operation, allowing a statically placed spin wave detector to measure focused spin waves of different wavelengths, depending on the strength of the external biasing field applied. Thus, sweeping across a range of external biasing fields can enable a single sensor to detect and measure spin wave amplitudes of multiple wavelengths.

During operation, a biasing field of a first strength may cause waves of a first wavelength to be focused at a particular focal point on the Rowland circle. A detector placed at that focal point can read out (e.g., using the inverse spin Hall effect) the magnitude of those spin waves. Then, the biasing field strength can be adjusted to a second strength, causing waves of a second wavelength to be focused at that same focal point. The same detector may then read out the magnitude of the second wavelength-focused spin waves.

The relationship between biasing magnetic field strength and the wavelength focused at a particular focal point can be predetermined based on the arrangement of the components of the spectrum analyzer and the physical properties of the magnetic film. This predetermined relationship can be stored as an algorithm or formula on a computing device or implemented as dedicated circuitry.

Figures 7A, 7B:
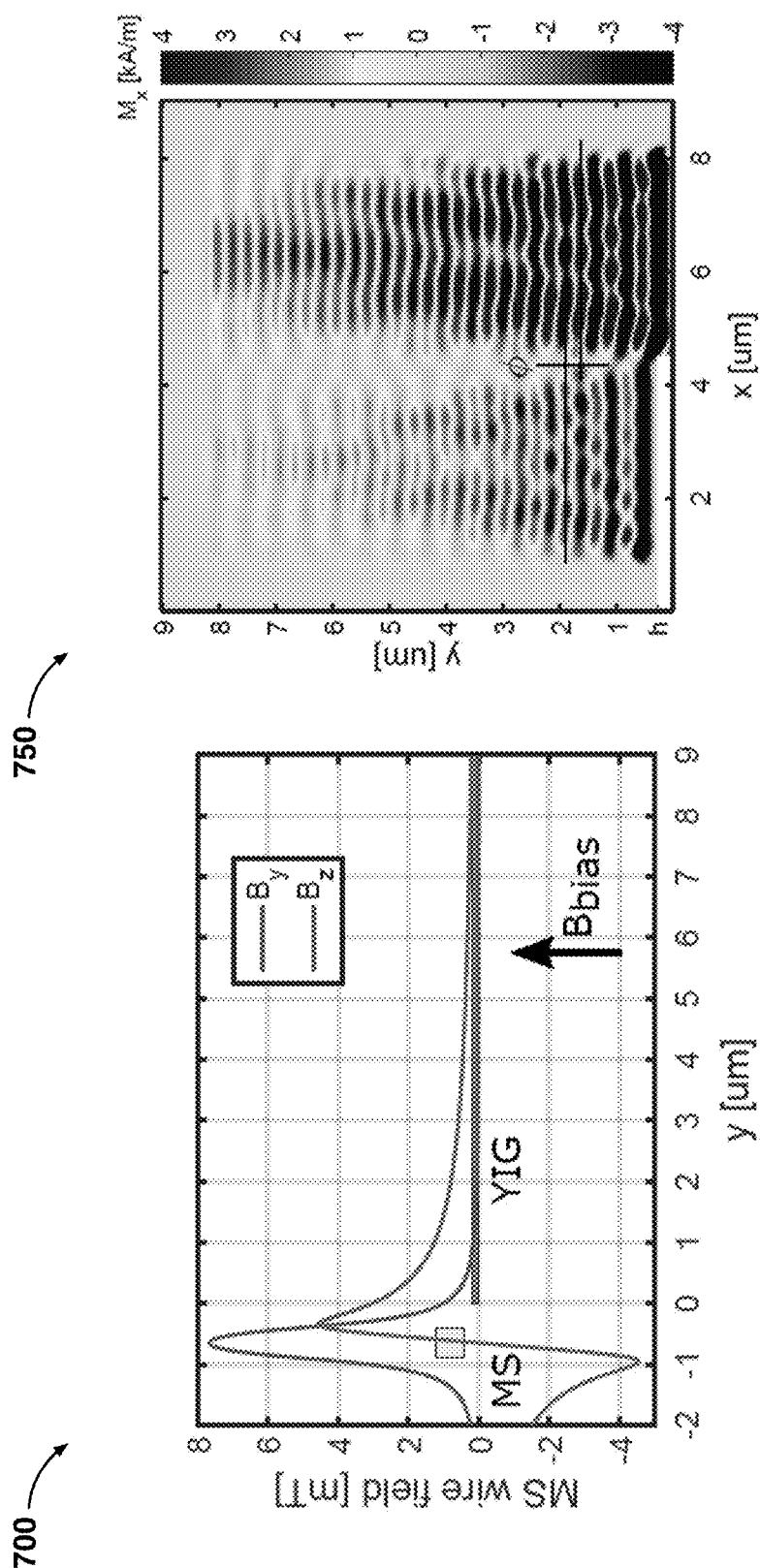
FIG. 7A is a graph of magnetic field strengths of an antenna according to an example antenna arrangement.
FIG. 7B is a graph depicting a time snapshot of a magnetization of a YIG film, demonstrating the phase shift to spin waves introduced by a patterned edge in the YIG film.

The edge of a magnetic film, with a microstrip line running next to it, can act as the source of spin waves. An example geometry is illustrated in FIG. 7A. The Oersted field of the current that runs through the microstrip line generates spin waves at the edge of the film.

The magnetic field of microstrip waveguides is generally not well-localized. Waveguides tend to be inefficient in creating spin waves with wavelengths that are smaller (or comparable) to their width. However, at the edge of a magnetic film, the demagnetization field changes abruptly. It is the net magnetic field (which is the superposition of demagnetization field, the waveguide-generated Oersted field, and other effective field components) that is responsible for the generation of the spin waves. The abruptly-changing field at the edge of the waveguide is a significantly more efficient coherent source of spin waves than the waveguide alone.

Generating spin waves by the boundary of the magnetic film has another significant benefit: it enables precise phase-shifting of the waves. A diffraction grating for micrometer-wavelength spin waves is able to introduce an initial phase shift at the spin-wave generation. This shift can be a few nanometers distance by patterning the boundary of the magnetic film.

An example time snapshot of the magnetization of YIG showing spin waves phase-shifting generated on the edge close to the microstrip (bottom) is shown in FIG. 7B. By patterning the film edge phase shifts may be introduced to the coherent wavefront. The h=270 nm step was designed to introduce an initial phase difference of $\phi=\pi$. The width of the waveguide in this example is w=500 nm and its calculated magnetic field is depicted in FIG. 7A. The magnetic field of the MS line was calculated numerically by integrating the field components generated by small sections of the MS wire using Amperes law. In this simplified simulation model we assumed uniform current distribution and neglected the effect of the ground plane and the dielectric. The calculated field is concentrated around the MS wire, where the magnetic film edge is located. Consequently, the magnetic film edge experiences almost exactly the same field at the two sections of the step, but in one side the source is shifted by the h step size.

A periodic structure built from the steps of FIG. 7B, with the waveguide running by, can simultaneously act as the spin-wave source and diffraction grating in a spin-wave-based Rowland circle.

Micromagnetic simulations (OOMMF12) were conducted to verify and demonstrate the spectrum analyzer described herein. OOMMF solves the Landau-Lifshitz-Gilbert equations in the time domain. This approach is based on the fundamental equations of micromagnetics and avoids most approximations—however, it is computationally intensive. For two-dimensional structures typically a few micrometer by few micrometer size structure is reasonable to simulate.

The simulation involved a 10 nm thick YIG film with saturation magnetization $$M_S = 1.4 \times 10^5 \frac{A}{m},$$

exchange constant $$A_{exch} = 3.65 \times \frac{10^{-12} J}{m}$$

and $\alpha=0.001$ damping constant. A lateral cell size of 30 nm was chosen—while this is a relatively coarse discretization, it allows the simulation of a 15×15 µm area on an average workstation and within a day of simulation time. The out-of-plane external bias field was set to $B_{bias}=520$ mT, which according to the dispersion relation corresponds to a wavelength of $\lambda\approx 525$ nm at a frequency f=10 GHz.

The geometry of the magnetic film follows the design described above: at the bottom of the structure there is the curved grating, serving also as the source of spin waves. This edge of the YIG film was patterned in a cogged shape on an arc with a radius of 2R=12 µm, where R is the Rowland circle radius. The grating constant was set to equal the double of the wavelength d=2λ at 10 GHz and the height of the cogs is $$h = \frac{\lambda}{2}$$

which equals of a phase shift of π.

The input signal, which is the magnetic field of the waveguide, appears in the simulation as a time varying external magnetic field. In the present example, this field is a superposition of two sinusoidally varying magnetic fields at $f_1=10$ GHz and $f_2=10.25$ GHz. The field distribution of the waveguide was calculated numerically in an independent simulation as described previously, assuming a microstrip line with width $w_{ms}=500$ nm, thickness $t_{ms}=200$ nm and dielectric thickness $t_{diel}=100$ nm. The microstrip were placed 400 nm far from the YIG film. The microwave current amplitude in the line was 0.5 mA. The current distribution and the waveguide magnetic field were calculated using HFSS a full-wave electromagnetic simulator. The influence of the magnetized film to the waveguide was ignored.

On the other three edges of the YIG film absorbing boundary conditions were realized by a linearly increasing damping coefficient in a 900 nm region up to a maximum damping constant $\alpha=0.5$. This boundary condition substantially eliminates most reflections from these edges, effectively simulating an infinitely extended film in these directions.

The simulation was performed in two steps: in an initial simulation, only the bias magnetic field was applied, without the oscillating field component and the damping constant was set to $\alpha=0.5$ everywhere. With the artificially high damping constant, the simulation quickly converges to a steady-state M(r) magnetization distribution. In the following simulation, the damping constant was set to its real, low value and the oscillating field of the waveguide is applied. The spin waves appear as small (few-percent) perturbations on top of the previously calculated magnetization distribution.

Figures 8A, 8B:
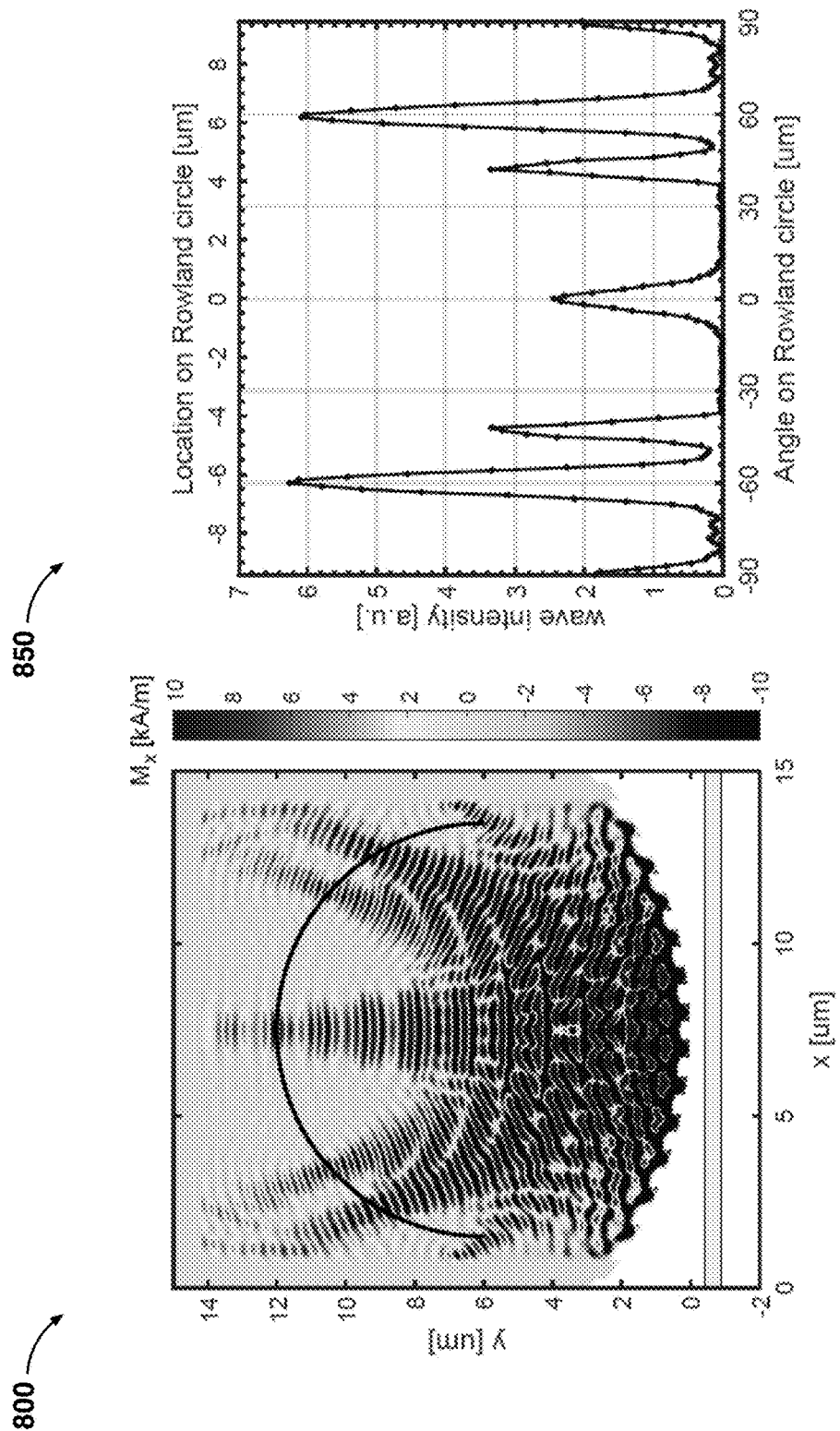
FIG. 8A is a graph depicting a time snapshot of a magnetization of a YIG film having a concave patterned edge.
FIG. 8B is a graph illustrating spin wave intensity measured at points along a circumference of a Rowland circle.

FIG. 8A shows a snapshot of the magnetization distribution from the simulation. FIG. 8A depicts a contour plot 800 of the $M_x$ magnetization component ($M_y$ would look similar). An interference pattern is formed, as expected from the theory of the Rowland spectrograph. The results confirm that in the chosen parameter regime, the spin waves behave as expected from the simple picture based on linear waves.

FIG. 8B depicts a graph 850 of the amplitude of waves in the simulation on the Rowland circle. The finite width of the peaks is caused by diffraction, which should set the width of peaks to be approximately equal to the wavelength—this is what is seen in the output intensity distribution of FIG. 8A. This allows the simulated device to resolve only a few peaks (in this example, approximately four peaks); this is due to the very small simulation domain.

The amplitude of the two frequency components in the microwave signal were set to be equal, but FIG. 8A shows two different amplitudes corresponding to these frequencies. This is due to the geometry of the grating used. On this grating, all wave components experience the same periodic shifting in distance, but this distance shift corresponds to different phase shifts depending on the wavelength. Thus the grating is not equally effective at every wavelength, which results in smaller amplitudes. Other effects that cause amplitude differences include smaller spin-wave-generation efficiency at smaller wavelengths, and the damping can also play a role in large device sizes. These effects can be taken into account by proper calibration of the read-out circuitry.

Note that the simulations were performed at T=0 K (i.e., they did not take into account thermal agitation of the magnetic moments). Thermal fluctuations appear as a wideband noise on top of the spin-wave signal and they superpose to other noise sources, such as the Johnson-Nyquist noise in the electrical components. Preliminary calculations show that the magnetic noise is negligibly small compared to Johnson-Nyquist noise in the magnetoelectrical interfaces.

A practical signal processing device has electrical inputs and outputs—even if signal processing itself is done outside the electrical domain. As discussed herein, the conversion of electrical signals into spin wave signals is possible. For YIG-based devices, magnetostatic waves appear as a few-hundred ohms per centimeter load to waveguides. This means that for the millimeter-sized devices described herein, the magnetic film represents a negligibly small load to the waveguide. Most microwave energy is dissipated at the load terminating the waveguide and only a few percent of the microwave energy is converted into spin waves. Still, at least a few milliwatts of microwave power is required, which is very small to the often several-watts consumption of microwave devices.

Once the spin waves have propagated through the magnetic material, the device may convert the very low energy spin-wave signals back to the electrical domain. Read-out of spin waves is possible by micron-scale antennas (via the inverse spin Hall effect). In either case, the output signal is approximately in the few to ten microvolt range. Receiving and amplifying such small signal levels and at a significant bandwidth may involve significant circuitry, including amplifiers and filters that restrict the bandwidth in order to limit resistive noise. Inverse Spin-Hall effect-based readout is more practical as the resulting DC voltage can be picked up with slower output circuitry.

CMOS-based circuitry may be used to read or measure properties of spin waves. In some examples, a magnetic loop antenna may be placed on a surface of the magnetic film. The circuit analog of such magnetic loop antennas may be similar to RL circuits with an added voltage generator which represents voltage fluctuations induced by the spin waves in the magnetic film.

An example loop antenna is placed on top of a magnetic insulator (e.g., a YIG film), and may be rectangular in shape with a length of 1 µm. The width of the wire forming the loop antenna in this example is 100 nm.

Determining the peak value of the induced voltage can be estimated by assuming that $B_{surf}$ surface flux is generated by the out-of-plane component of the oscillating magnetization. For an in-plane magnetized plane $B_{surf} \approx \mu_0 M_{defl} M_s$, where $M_{defl}$ is the relative spin-wave amplitude and the $M_s$ is the saturation magnetization of YIG. The voltage in this approximation results as:

$$V \approx \mu_0 M_{defl} M_s A f \quad (4)$$

with A being the loop area and f is the spin wave frequency.

Assuming A=1 µm² loop area and $M_{deff} \approx 0.1$, Eq. 4 above gives V≈17 µV. Eq. 4 also assumes that the loop surface and the spin wave length are matched to each other, such that there are no multiple spin wave periods inside the loop.

Once the voltage has been measured, readout circuitry may amplify, mix, frequency shift, or otherwise modify the measurement to be sampled by an analog-to-digital converter (ADC). The measured signal may be adjusted to be compatible with ADC requirements, or may be adjusted to convert from spin wave voltage levels to a spectral component value, such as a power level of a particular wavelength of a source signal used to produce the spin waves.

Although the present application describes sensors for measuring current or voltage induced by spin waves in a magnetic film, it should be understood that other embodiments may involve detecting other properties of the magnetic film or spin waves propagating therein. For instance, a spin wave may cause thermal fluctuations in the magnetic film as the electrons are energized and precessing about a spin axis. Sensors such as thermal couples could measure changes in temperature from which properties of the spin wave may be inferred. It should be understood that the scope of the present application includes a variety of sensors measuring any property of the spin waves or secondary effects caused by the propagation of spin waves.

Spin wave based processing has utility beyond spectrum analyzers. Akin to optical computing devices, spin wave interference may perform a large class of linear transforms (such as wavelet transform) that may find use in data processing, image processing or scientific computing applications where high-speed and/or energy efficiency is of importance. Convolution and deconvolution algorithms can also be accomplished in the spin wave domain, which are useful in radio frequency (RF) devices (such as in frequency-domain equalizers) and also for high-speed computing tasks. Beyond the processing of time-domain signals, which is done in the spectrum analyzer invention, many-input, many-output vector to vector mappings are possible.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. A device comprising:
    a magnetic film having a concave patterned edge, wherein the concave patterned edge forms an arc having a first radius;
    an antenna disposed laterally adjacent to the concave patterned edge and substantially coplanar with the magnetic film, wherein the antenna is operable to generate a magnetic field based on a source signal that interacts with at least the concave patterned edge of the magnetic film to produce spin waves in the magnetic film; and
    at least one sensor on the magnetic film positioned substantially at a particular location along a circumference of a Rowland circle having a second radius, wherein the first radius is greater than the second radius, and wherein the at least one sensor is operable to measure at least one physical property of the magnetic film at the particular location.

2. The device of claim 1, wherein the particular location along the circumference of the Rowland circle is associated with a known wavelength, and wherein an amplitude of the at least one physical property is proportionate to an amplitude of the known wavelength of the source signal.

3. The device of claim 1, wherein the at least one sensor is a loop antenna disposed vertically adjacent to the particular location, wherein the spin waves produce an oscillating magnetic field, and wherein the at least one physical property includes a voltage induced in the loop antenna by the oscillating magnetic field.

4. The device of claim 1, wherein the at least one physical property includes a spin wave amplitude measured at the particular location of the magnetic film.

5. The device of claim 1, further comprising:
    a signal generator electrically coupled to the antenna and operable to generate the source signal, wherein the source signal is alternating current that causes the antenna to generate the magnetic field.

6. The device of claim 1, wherein the magnetic film is formed from a ferromagnetic material.

7. The device of claim 1, wherein the antenna is a microstrip.

8. The device of claim 1, wherein the at least one physical property is measured based on a spin Hall effect or an inverse spin Hall effect.

9. The device of claim 1, wherein the first radius is twice that of the second radius.

10. The device of claim 1, wherein the magnetic film is formed from a ferrimagnetic material.

11. The device of claim 10, wherein the ferrimagnetic material is yttrium iron garnet (YIG).

12. The device of claim 10, wherein the ferrimagnetic material is Barium ferrite (BaM).

13. The device of claim 1, further comprising:
    a biasing field generator operable to produce a magnetic bias field across the magnetic film.

14. The device of claim 13, wherein the biasing field generator is configured to:
    apply a first biasing field strength causing waves of a first wavelength to focus at the particular location; and apply a second biasing field strength causing waves of a second wavelength to focus at the particular location.

* * * * *

UNITED STATES PATENT AND TRADEMARK OFFICE
CERTIFICATE OF CORRECTION

Page 1 of 1

PATENT NO. : 10,613,129 B2
APPLICATION NO. : 15/439639
DATED : April 7, 2020
INVENTOR(S) : Gyorgy Csaba et al.

It is certified that error appears in the above-identified patent and that said Letters Patent is hereby corrected as shown below:

In the Specification

In Column 1, Line 15, change the GOVERNMENT LICENSE RIGHTS section to:
--This invention was made with government support under grant NEB1124850 awarded by the National Science Foundation. The government has certain rights in the invention.--

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*